United States Patent [19]

Corwin et al.

[11] 4,156,844
[45] May 29, 1979

[54] MULTI-CHANNEL GALVANOMETER ASSEMBLY

[75] Inventors: William C. Corwin, La Grange; Raymond M. Pawlak, Addison, both of Ill.

[73] Assignee: Beckman Instruments, Inc., Fullerton, Calif.

[21] Appl. No.: 874,723

[22] Filed: Feb. 3, 1978

[51] Int. Cl.² .................. G01R 11/02; G01R 1/16
[52] U.S. Cl. .................. 324/114; 324/151 R; 346/139 R
[58] Field of Search ............ 324/114, 113, 151 R, 324/97; 346/139 R

[56] References Cited

U.S. PATENT DOCUMENTS

| 2,478,329 | 8/1949 | Shaper | 324/113 |
| 3,273,061 | 9/1966 | Rumpelein et al. | 324/151 R |

Primary Examiner—Rudolph V. Rolinec
Assistant Examiner—Ernest F. Karlsen
Attorney, Agent, or Firm—Robert J. Steinmeyer; Paul R. Harder; Frank J. Kowalski

[57] ABSTRACT

An improved multi-channel galvanometer assembly is disclosed particularly well adapted for use in such instruments as electroencephalographs and the like. The assembly includes a soft steel combination return path structure and frame supporting a plurality of galvanometer movements. The design employs pairs of samarium cobalt magnets held in place adjacent and on opposite sides of the coil of each galvanometer by magnetic attraction to the steel return path structure. The galvanometers themselves are each mounted on an aluminum support plate which also serves as a shield to prevent magnetic coupling between adjacent galvanometer coils when the galvanometers are assembled in the support frame. The galvanometers on their support plates are each individually removable and/or replaceable. The result is a lighter, smaller, multi-channel galvanometer assembly which is readily expandable and easily serviced.

8 Claims, 6 Drawing Figures

MULTI-CHANNEL GALVANOMETER ASSEMBLY

BACKGROUND OF THE INVENTION

The present invention relates to galvanometers and more particularly to galvanometers adapted for mounting in close adjacent spaced relationship to provide a multi-channel galvanometer assembly particularly well suited for use as a multiple pen motor assembly in multi-channel recording instruments such as electroencephalographs and the like.

A typical galvanometer pen motor used in a strip chart type recorder is shown with reference to FIGS. 1 and 2. In such apparatus, a coil of wire 10 is disposed for rotational movement about an axis 12. A pen 14 is operably attached to the coil 10 in such a manner as to rotate therewith about axis 12. Coil 10 and pen 14 are then biased by spring means (not shown) to remain in a neutral position until deflected therefrom by forces as will be hereinafter described. A strip of recording paper 16 is adapted to be moved under pen 14 in the direction of arrow 18 by appropriate drive means (also not shown). As paper 16 passes under pen 14, the pen (typically connected to a supply of liquid ink) causes a permanent recording line 20 to be marked on paper 16 continually and permanently indicating the position of the pen as the paper passes thereunder. Movement of coil 10 and pen 14 from the neutral position is caused by placing coil 10 in a magnetic field and applying varying electrical energy to coil 10. The electrical energy in coil 10 causes magnetic forces to be generated surrounding coil 10 which act in conjunction with the magnetic flux of the magnet field to deflect coil 10 in one direction or the other from the neutral position as indicated by the arrows 22.

In a typical prior art galvanometer assembly as shown in FIGS. 1 and 2, one or more permanent magnets 24 are employed adjacent coil 10 with opposite poles on either side of coil 10 to create the magnetic flux field. Because of the low coercive force of conventional magnets, a soft iron return path connecting the outside poles of the magnets 24 must be provided such as that labeled 26. Iron pole pieces 28 are also often employed so that the distance from the source of magnetic flux to coil 10 will be minimized. Additionally, an iron core 30 is usually disposed within coil 10 to minimize the amount of air gap across which the magnetic flux must flow. Examples of various configurations of such prior art galvanometers can be seen in the following U.S. Pat. Nos. :

866,387 J. Richard
2,102,409 H. T. Faus
2,355,237 T. J. Pethes, Jr.
2,478,329 H. B. Shaper
2,526,329 H. H. Chamberlain
2,535,065 C. A. Heiland
2,660,510 A. M. Grass
2,688,729 F. F. Offner
3,728,735 J. A. Burton An electroencephalograph (EEG) employs a plurality of galvanometer pen motors mounted in close adjacent spaced relationship to provide a multi-channel recorder output such as that shown in FIG. 3. Such an arrangement is shown in the patents to Shaper, Heiland, and Grass cited above. The signal being detected from each single electrode attached to the patient's scalp is amplified and conducted to an individual galvanometer pen motor 40 by electrical circuitry (not shown) which forms no part of the present invention. By shifting the position of the magnetic flux gap and turning the position of the pen 14' 90°, prior art galvanometer pen motors such as shown in FIGS. 1 and 2 can be disposed in close adjacent spaced relationship to provide the multi-channel recorder output 42 of FIG. 3. The above referenced patent to Shaper illustrates this approach. Because of the space occupied by the individual pen motors 40 in such an arrangement, the supply of paper 16 must be adapted to pass along guide means such as roller 44 shown in FIG. 4 in order to pass under pens 14' in the presence of galvanometer motors 40.

In a portable EEG instrument as presently employed in many medical applications, use of such inherently large galvanometer type recorder pen motors limits the number of channels which can be provided on the recorder as well as making the instrument itself heavy and cumbersome for portable use. Moreover, servicing and/or replacement of an individual channel galvanometer pen motor requires the complete removal and replacement of the total pen motor assembly. If an instrument is sold with less than a full complement of pen motors, the later addition of additional channel recording capability requires the costly purchase and complex installation of a complete galvanometer pen motor for each of the desired additional channels.

Wherefore, it is the object of the present invention to provide a multi-channel galvanometer assembly which is lighter and more compact than that possible employing the technique of the prior art and which is readily expandable and easily serviced.

SUMMARY

The objects of the present invention are realized in the present invention by employing a single, light weight, mild steel return path structure which also serves as a frame for supporting up to at least 20 galvanometers while minimizing the return path length and flux density. The magnetic field is supplied by samarium cobalt magnets disposed in pairs adjacent and on opposite sides of the coil of each galvanometer position. The magnets are not fastened, but are held in place by an aluminum guide frame and their own magnetic attraction for the soft iron of the return path structure. The individual galvanometer movements themselves comprise a removable aluminum support structure which also acts as a shield to prevent magnetic coupling between adjacent galvanometer coils. Each aluminum support structure has a soft steel core mounted thereon having the galvanometer coil disposed around the periphery of the core and mounted for rotational movement. To repair or service an individual galvanometer, only the aluminum support structure containing the core and galvanometer coil need be removed. To add a new galvanometer in a position where none exists, a pair of magnets are inserted into the guide slots adjacent the position and the galvanometer coil assembly is slid into place and secured.

DESCRIPTION OF THE PREFERRED EMBODIMENT

Figure 1:
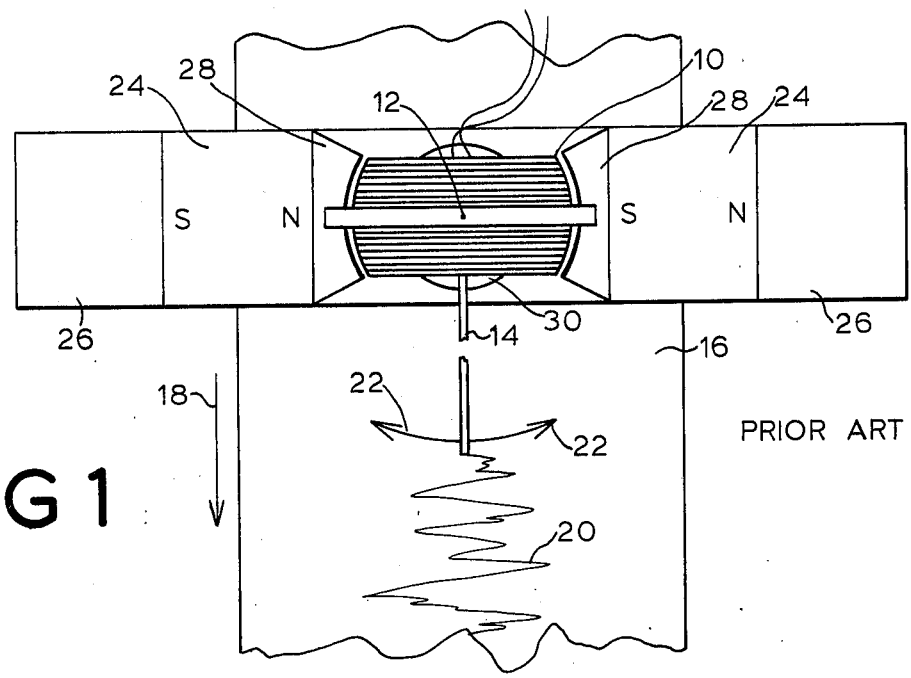
FIG. 1 is a simplied top view of a prior art galvanometer pen motor for a single channel.
Figure 2:
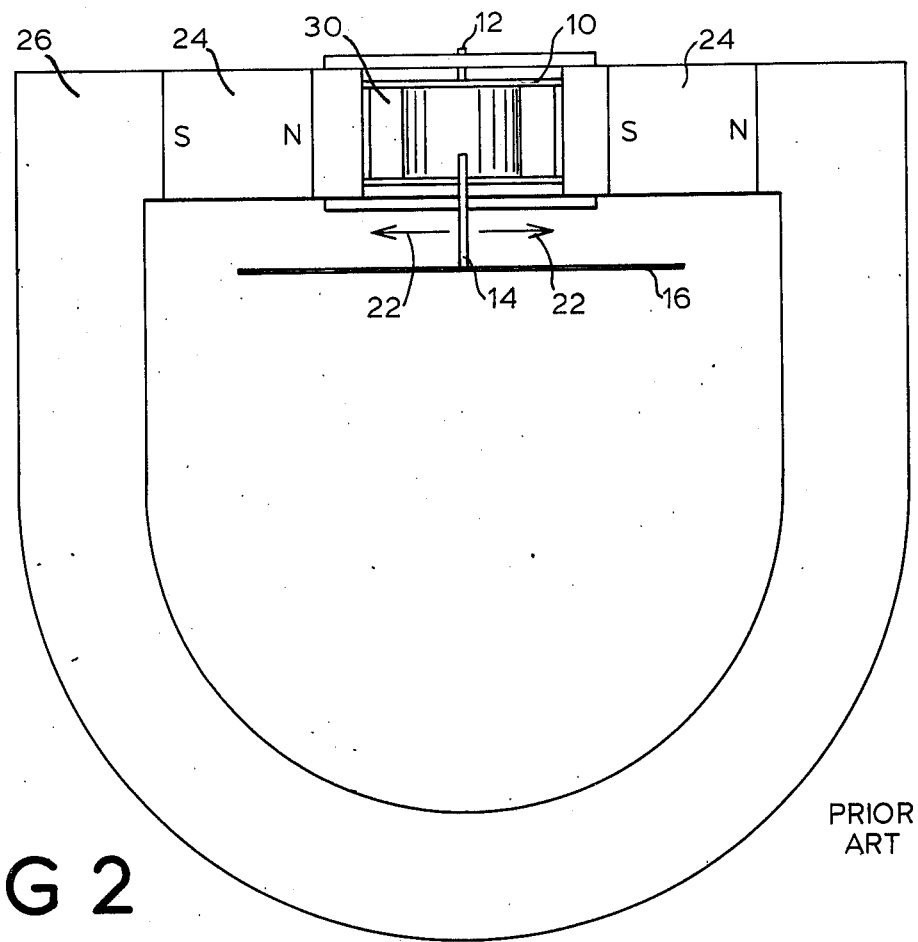
FIG. 2 is a simplified elevation of the single channel galvanometer pen motor of FIG. 1.
Figure 3:
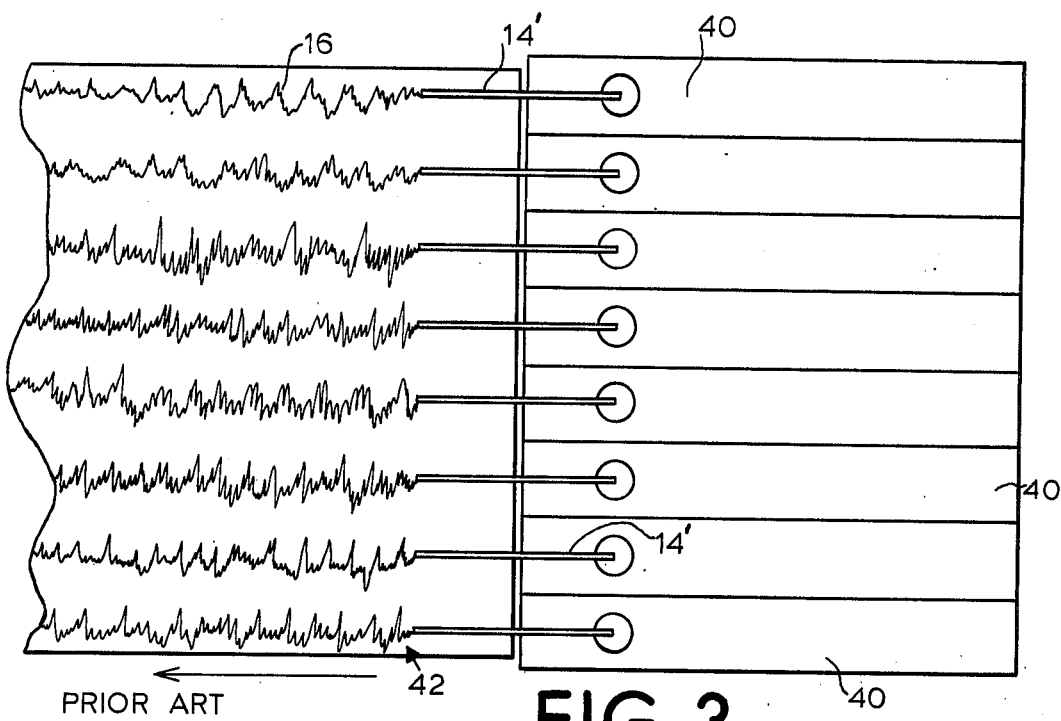
FIG. 3 is a top view of eight prior art pen motors mounted in close adjacent spaced relationship to provide a multi-channel recording output capability for apparatus such as an EEG.
Figure 4:
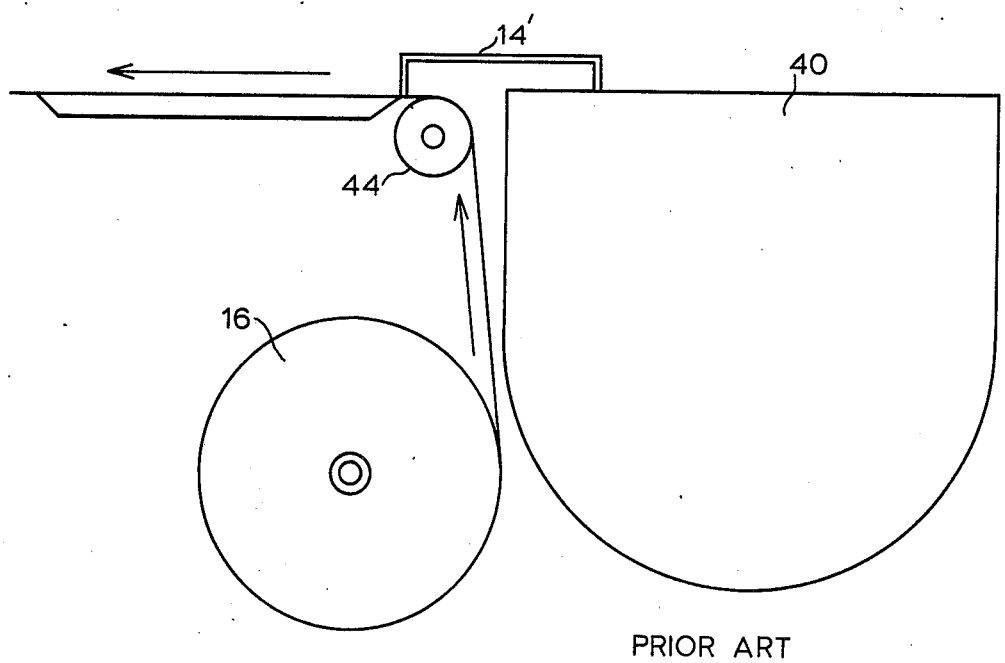
FIG. 4 is a side elevation of the prior art apparatus of FIG. 3.
Figure 5:
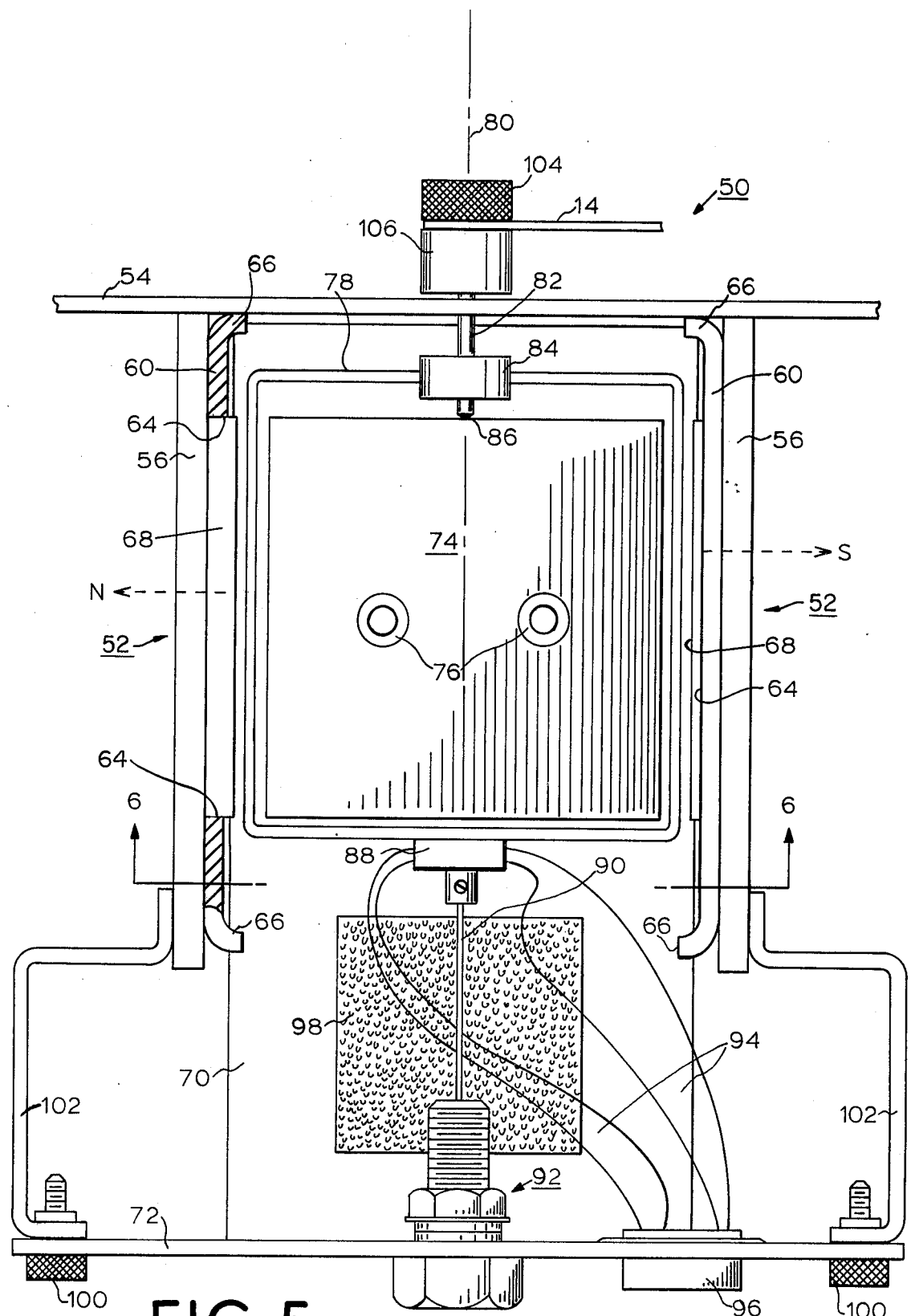
FIG. 5 is a side elevation of the support structure and a single channel galvanometer pen motor according to the present invention.

The improved multi-channel galvanometer assembly of the present invention is shown in FIG. 5 and generally indicated as 50. The basic element of the assembly 50 is the substantially rectangular frame labeled 52. Frame 52 not only serves as a means for removably supporting the galvanometers in a manner which will be hereinafter described in greater detail, but, additionally provides a common magnetic return path for all the galvanometer magnets. In the preferred embodiment shown, as employed in an EEG instrument built by the assignee of the present invention, frame 52 is attached to a top plate 54 from which the whole assembly 50 can be hung in the EEG instrument. As can best be seen with reference to FIG. 6, frame 52 comprises two substantially parallel soft steel side members 56 connected to each other with two aluminum end members 58 or the like to form the rectangular "box" structure shown. On one side of the frame between side member 56 and end members 58 are included spacers 62 which allow for use of stock sizes of aluminum end members and are used to adjust the air gap, as is hereinafter more fully described.

Referring once again to FIG. 5, the two side pieces 56 each have a magnet and card guide 60 constructed of a nonmagnetic material disposed in parallel adjacent relationship thereto. It is preferred that the guides 60 be constructed of aluminum and are attached to the soft steel side members by any suitable means, such as rivets, not shown. For ease of understanding, in FIG. 5, one guide 60 is shown in cutaway view and the other is not. The guides 60 serve two functions. First, each guide 60 contains an opening 64 adjacent each position to be occupied by a galvanometer motor. The openings 64 are rectangular and sized to accommodate the magnets to be employed as will be hereinafter discussed in greater detail. As a second function, each guide 60 is adapted to position a galvanometer when it is inserted into the frame 52. This is best accomplished in the manner shown as by curving the ends of guides 60 inwardly at the point designated 66 in FIG. 5 and cutting a slot therein through which the galvanometer support card to be described hereinafter can pass.

The design of the present galvanometer assembly is made possible by the recent development of rare earth cobalt magnets. In particular, a tested embodiment of the present invention employs samarium cobalt magnets. The samarium cobalt magnets employed are one quarter inch thick, of rectangular shape ($\frac{1}{2} \times 1\frac{1}{2}$ inches) and have a sufficiently high intrinsic coercivity that they can maintain a 5.5 k Gauss field in the 0.1 inch gap employed. Contrary to the normal rectangular magnet, the samarium cobalt magnets employed are magnetized along an axis normal to the longitudinal axis. That is, the magnetic attraction is to the broad surfaces (rather than to the ends) as shown by the dotted arrows labeled N and S of FIG. 5 designating the North and South poles, respectively. The permeance of this magnetic circuit is 2.0, which is greater than the 1.0 for optimum energy use but which is needed for an adequate magnetic field in the gap. At each position in frame 52 where a galvanometer motor is to be inserted, the rectangular samarium cobalt magnets 68 are inserted into the rectangular openings 64 where they are prevented from falling out by the magnetic attraction of the magnets 68 for the soft steel material of sides 56 and prevented from lateral movement by the close fitting sides of the openings 64 in guides 60.

The galvanometer movement at each position is mounted on an aluminum card 70. By making the cards 70 rectangular as shown in FIG. 5, they can be slipped between the guide slots in fingers 66 of guide 60 to be properly positioned with respect to magnets 68 in a manner to be hereinafter described in greater detail. Each aluminum card has an integral mounting bracket portion 72 opposite top plate 54 formed by bending the mounting bracket portion at right angles to the remainder of the card whereby the card 70 can be mounted relative to frame 52. Additionally, bracket portion 72 provides a point of mounting for a portion of the suspension system for the galvanometer coil itself. Card 70 has a soft steel core 74 of substantially rectangular shape attached thereto such as with rivets 76. An aluminum spacer 75 is interposed between the card 70 and core 74. Core 74 is positioned to have two sides parallel to magnets 68 which are in turn parallel to sides 56. The other two sides of core 74 are disposed to be parallel to top plate 54 and mounting bracket 72, respectively. A galvanometer coil 78, also of substantially rectangular design, is disposed in the plane of core 74 about the periphery thereof and mounted for rotational movement about an axis 80 disposed longitudinally through core 74 parallel to both side members 56 and end members 58 and substantially midway between side members 56. In the preferred embodiment, the air gap between magnets 68 and the sides of core 74 disposed parallel thereto wherein coil 78 is mounted, is 0.146 inch. This gap may be maintained by the appropriate selection of spacers 62 in the main frame. Further, coil 78 is approximately 0.065 inches thick and 1.356 by 1.78 inches in width and height, respectively. Rotatability about axis 80 as well as the restorative force to maintain the galvanometer motor in its neutral position is accomplished by the mounting system shown in FIG. 5 wherein shaft 82 passes through a first mounting block 84 disposed on one side of coil 78 to terminate in a bearing point 86 common to shaft 82 and core 74. On the opposite side of coil 78, second mounting block 88 is disposed which is connected to a torsion bar 90 which in turn is adjustably attached to mounting bracket portion 72 of card 70 as with bolt and nut assembly 92. In the preferred embodiment, coil 78 comprises a main winding, being four layers of 32 gauge wire, for providing the deflection potential from the neutral position as well as a velocity feedback winding, being one layer of 35 gauge wire (necessary since the magnetic damping of the coil and frame is not sufficient). Second mounting block 88 also serves as a connecting point for the two pairs of leads 94 from the two windings of coil 78. Leads 94 terminate in connector 96 on bracket portion 72 which allows the electrical connection to each galvanometer to be easily attached and removed as necessary. It is preferred that leads 94 be prevented from random movement which could produce an error force on coil 78 by the use of appropriate holding means 98 such as sold under the name VELCRO available from the Velcro Corp. of New York. Once card 70 is inserted through guides 60, it is preferably maintained in this position such as by the use of thumbscrews 100 in conjunction with mounting brackets 102 mounted on frame 52. A pen 14 can be mounted on shaft 82 for movement by a mounting thumbscrew 104 which is screwed into mounting collar 106 which in turn is connected to shaft 82 with pen 14 disposed between thumbscrew 104 and collar 106 as shown.

Figure 6:
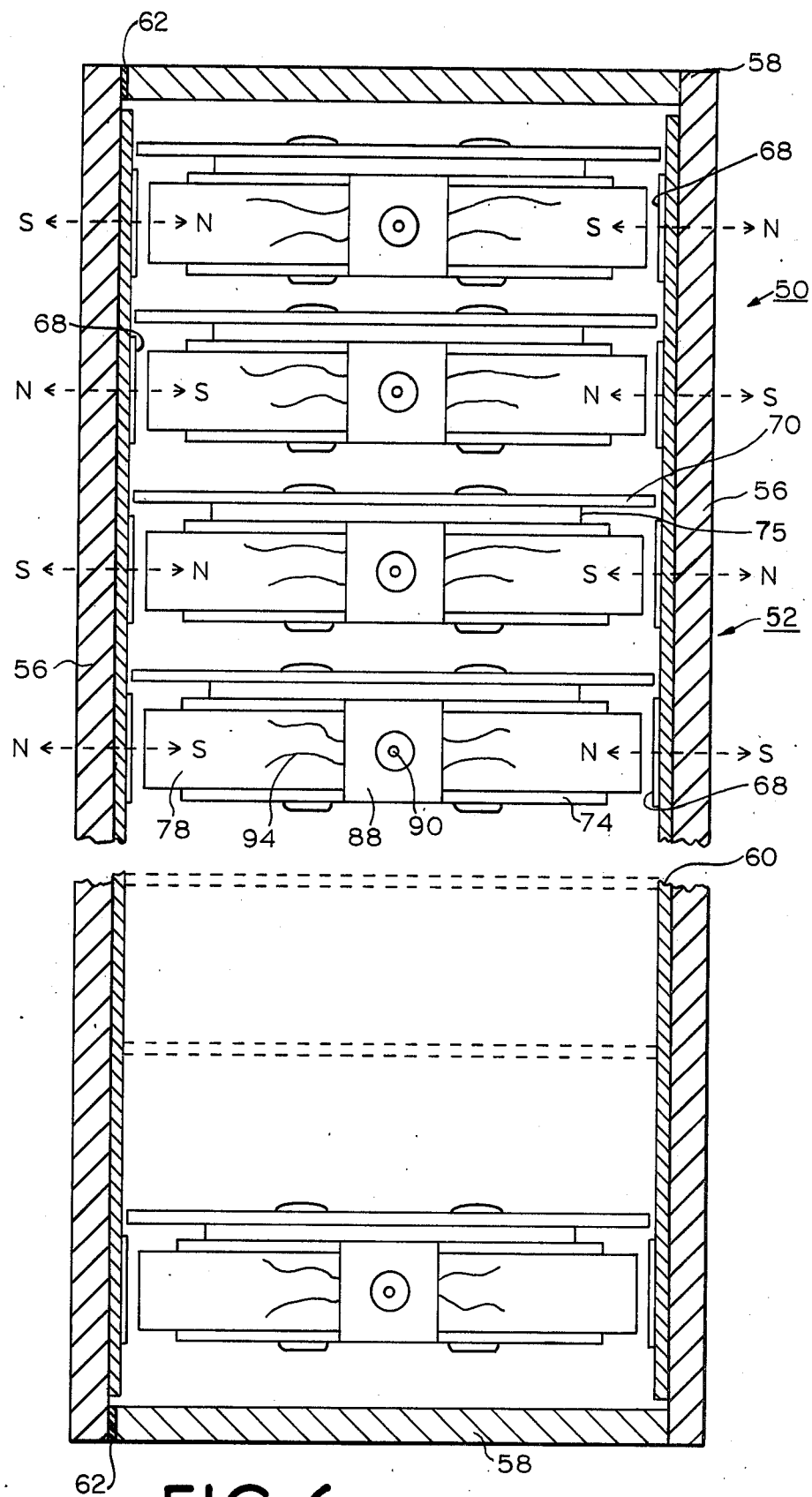
FIG. 6 is a bottom view of the multi-channel galvanometer assembly of the present invention showing a plurality of galvanometers operably disposed and indicating the positional provision for additional galvanometers.

Referring now to FIG. 6, a plurality of galvanometers are shown mounted in frame 52 as seen from the position cut through and labeled 6—6 on FIG. 5. When mounting such a plurality of galvanometers as shown, each postion has its magnets 68 mounted with opposite polarity to those in the galvanometers on either side of it as shown by the dotted arrows labeled N and S indicating the poles of the magnets. In this manner, the frame 52 also serves as a return path structure in which half of the flux goes in one direction to one next adjacent magnet 68 and the other half goes in the opposite direction to the other next adjacent magnet 68 both being of opposite polarity Thus constructed, this structure accommodates the energetically favored alternating magnetic field configuration. The use of aluminum end members 58 pervents shorting of the magnetic field.

With the flux densities employed and possible using the samarium cobalt magnets 68, it is possible to use soft steel (which is easier to work with) for cores 74. The soft steel cores 74, however, will allow magnetic coupling between adjacent galvanometer coils 78 unless provision is made for shielding. In the preferred embodiment of the present invention shown, the aluminum cards 70 serve the dual function of mounting and shielding. As can be seen, each core 74 is shielded on one side from its next adjacent core 74 by its own aluminum card 70 and shielded on the opposite side by the card 70 of its neighboring galvanometer.

If it is desired to add additional galvanometers at one or both of the two positions shown by the ghost lines on FIG. 6, one need only insert the magnets 68 (observing the correct polarity) into the guide holes 64 at each desired position and then insert the galvanometer on its card 70 into position securing it there with mounting thumbscrews 100. Mounting collar 106 can then be secured to shaft 82 and a pen 14 attached thereto using mounting thumbscrew 104. By attaching the appropriate amplifier lead connector to connector 96 at the new position, the new galvanometer is ready to operate. For servicing, a galvanometer can be removed from any position by merely reversing the above enumerated procedure. That is, the amplifier connector (not shown) is removed from its engaged position with connector 96, thumbscrew 104, pen 14 and collar 106 are removed from shaft 82, knurled mounting thumbscrews 100 are removed, and card 70 is removed from frame 52 to allow servicing of the parts mounted thereon.

Having thus described our invention, we claim:

1. An improved galvanometer assembly comprising:
   (a) a support and magnetic return path structure having two parallel side members of a magnetic flux conducting material and two parallel non-magnetic flux conducting end members connected together to form a generally rectangular box;
   (b) a pair of non-magnetic magnet and card guides disposed within said structure with one guide in parallel adjacent relationship to each of said side members, each of said magnet and card guides having an opening therein disposed opposite a similar opening in the other guide at a position wherein a galvanometer movement is to be placed, said magnet and card guides further having means for holding a galvanometer card at said position;
   (c) a pair of magnets disposed in said magnet and card guides with one of said magnets in each of said openings;
   (d) a non-magnetic galvanometer card removably held parallel to said end members at said galvanometer position by said holding means, said galvanometer card carrying a steel core thereon having a pair of sides between and substantially parallel to said magnets to form a parallel gap between said core and each of said magnets, said galvanometer card further having a galvanometer coil disposed in the plane of said core and about the periphery thereof, said coil being mounted for rotational movement about an axis disposed through said core parallel to both said side members and said end members, said galvanometer card also carrying biasing means connected to said coil for biasing said coil in one position, said coil having means for connecting said coil to a varying electrical signal.

2. The improved galvanometer assembly as claimed in claim 1 wherein:
   said magnets are rare earth cobalt magnets.

3. The improved galvanometer assembly as claimed in claim 2 wherein:
   said magnets are of samarium cobalt.

4. The improved galvanometer assembly as claimed in claim 1 wherein:
   (a) said galvanometer card is aluminum; and,
   (b) said core is soft steel.

5. An improved galvanometer assembly comprising:
   (a) a rectangular support structure having two parallel side members of magnetic flux conducting material and two parallel end members of non-magnetic flux conducting material;
   (b) a pair of non-magnetic magnet and card guide means disposed within said support structure, respective ones of such guide means being in parallel adjacent relationship to respective ones of said side members; each of said magnet and card guide means having a first plurality of openings therein for receiving a magnetic member, each of said opening being disposed opposite a similar opening in the other guide means and defining a plurality of galvanometer receiving positions, each of said guide means also having at least a second opening at each of said galvanometer receiving positions for receiving a galvanometer assembly card;
   (c) a magnet disposed in opposite ones of the first openings at at least some of said galvanometer receiving positions;
   (d) a non-magnetic galvanometer card removably secured at at least some of said galvanometer positions, said card cooperating with said second openings in said guide means to position said card at said galvanometer positions, a core of magnetic flux conducting material mounted on each of said cards and having a pair of sides between and substantially parallel to said magnets to form a gap therebetween, a galvanometer coil disposed in the plane of said core and about the periphery thereof, means securing said coil to said card for rotational movement about an axis parallel to each of said side and end members.

6. A galvanometer assembly according to claim 5 wherein said guide means are curved inwardly along opposite edges and said second openings are slots adapted to receive said galvanometer card along the edges of said card.

7. The galvanometer assembly according to claim 6 wherein there are included a pair of second openings in each of said guide means at each galvanometer position, said pair of opening being a slot in each of said inwardly curved edges.

8. The galvanometer assembly according to claim 7 further comprising mounting bracket means mounted on said parallel side members at each of said galvanometer positions for supporting said galvanometer card in said assembly.

* * * * *